United States Patent
Lin

(10) Patent No.: US 8,975,183 B2
(45) Date of Patent: Mar. 10, 2015

(54) PROCESS FOR FORMING SEMICONDUCTOR STRUCTURE

(75) Inventor: Jing-Cheng Lin, HsinChu Country (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 442 days.

(21) Appl. No.: 13/370,477

(22) Filed: Feb. 10, 2012

(65) Prior Publication Data
US 2013/0210198 A1    Aug. 15, 2013

(51) Int. Cl.
*H01L 21/44*    (2006.01)

(52) U.S. Cl.
USPC ............ 438/667; 438/108; 438/459; 438/464

(58) Field of Classification Search
USPC .......... 438/107, 108, 127, 459, 464, 666, 667
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Silwa, Jr. | |
| 5,075,253 A | 12/1991 | Silwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |

(Continued)

*Primary Examiner* — Thanhha Pham
(74) *Attorney, Agent, or Firm* — Duane Morris LLP

(57) ABSTRACT

A method for forming a semiconductor structure. A semiconductor substrate including a plurality of dies mounted thereon is provided. The substrate includes a first portion proximate to the dies and a second portion distal to the dies. In some embodiments, the first portion may include front side metallization. The second portion of the substrate is thinned and a plurality of conductive through substrate vias (TSVs) is formed in the second portion of the substrate after the thinning operation. Prior to thinning, the second portion may not contain metallization. In one embodiment, the substrate may be a silicon interposer. Further back side metallization may be formed to electrically connect the TSVs to other packaging substrates or printed circuit boards.

18 Claims, 4 Drawing Sheets

(56) References Cited

U.S. PATENT DOCUMENTS

| | | |
|---|---|---|
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2006/0043569 A1* | 3/2006 | Benson et al. ............... 257/698 |
| 2010/0308474 A1* | 12/2010 | Shibuya et al. ............... 257/778 |

* cited by examiner

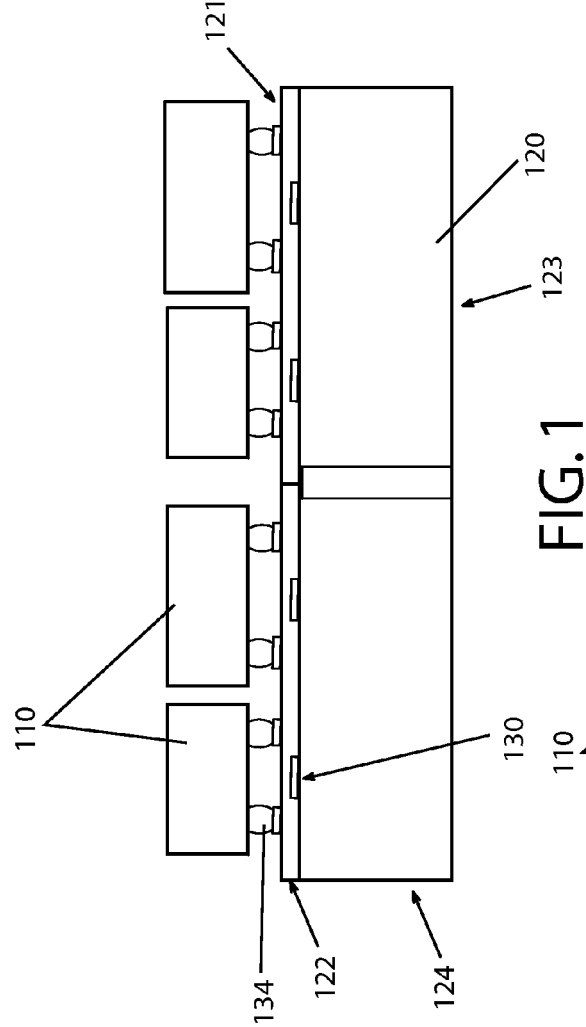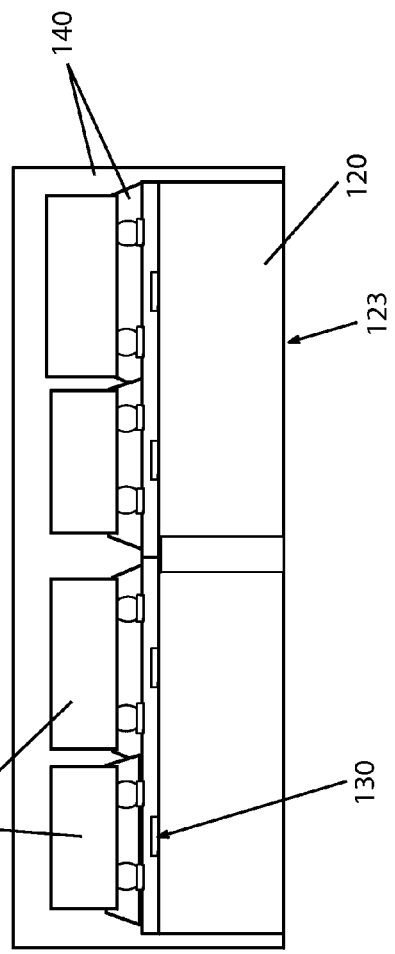

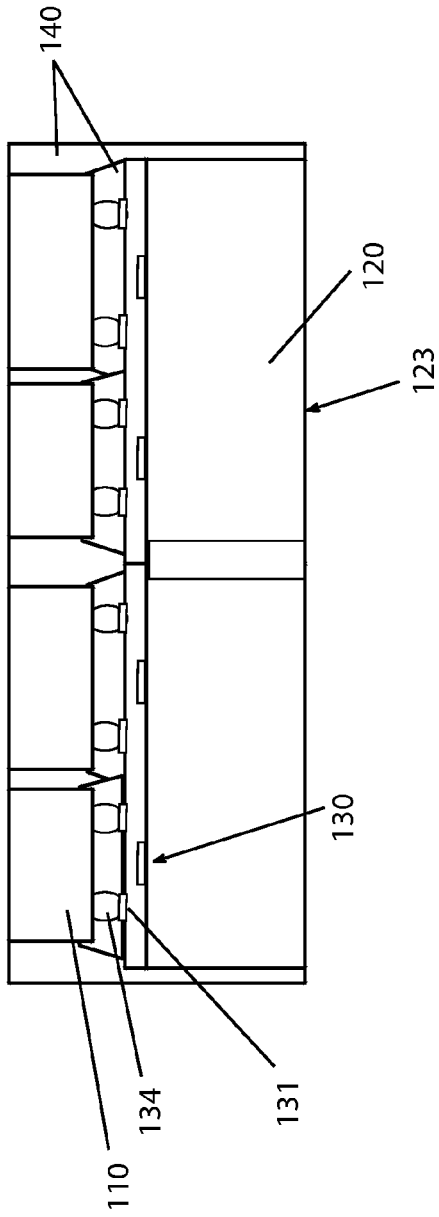
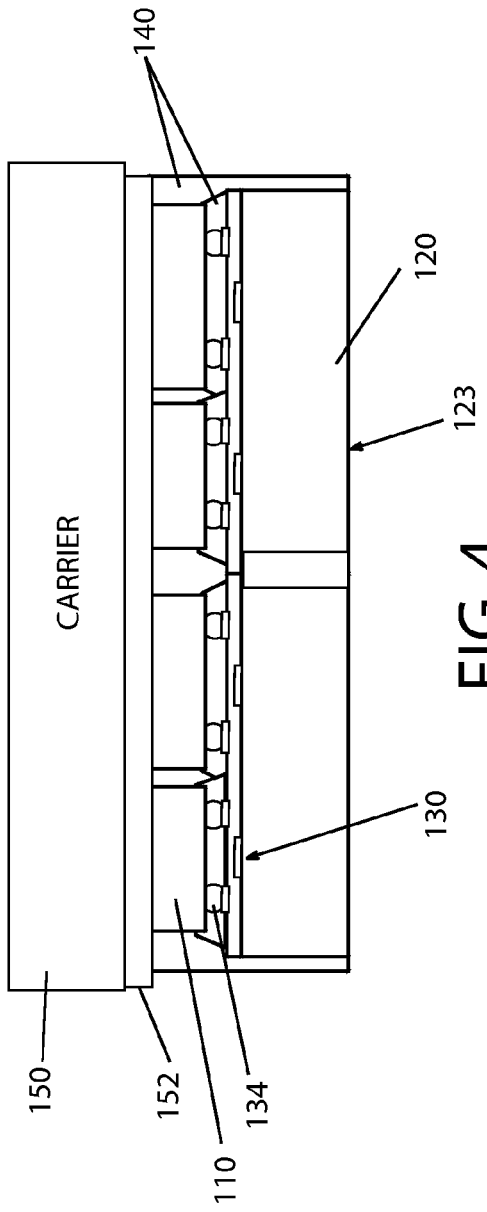

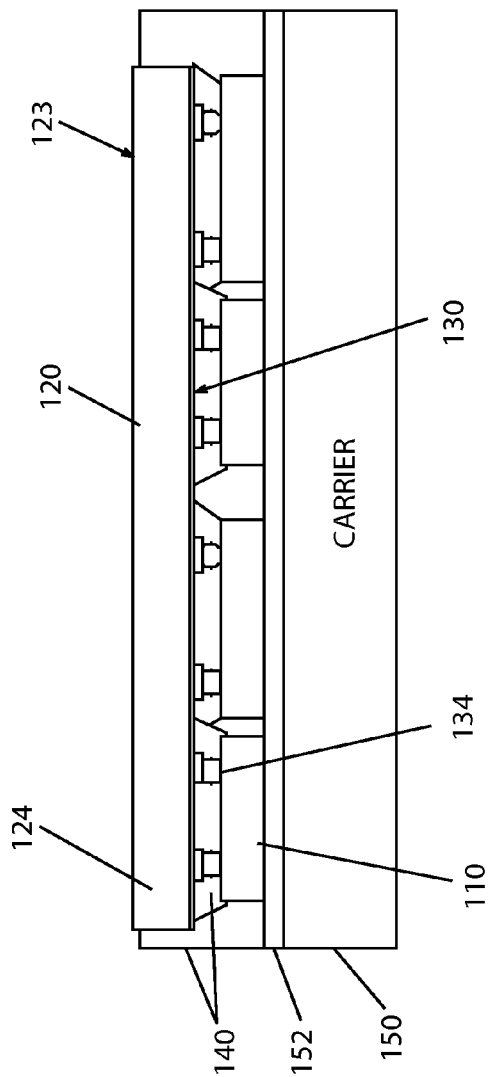
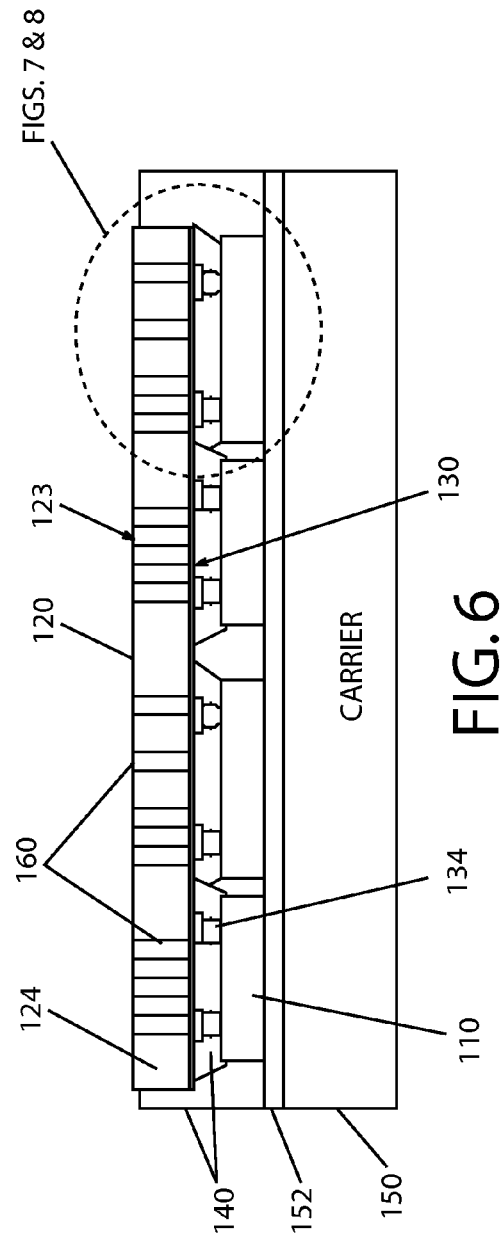

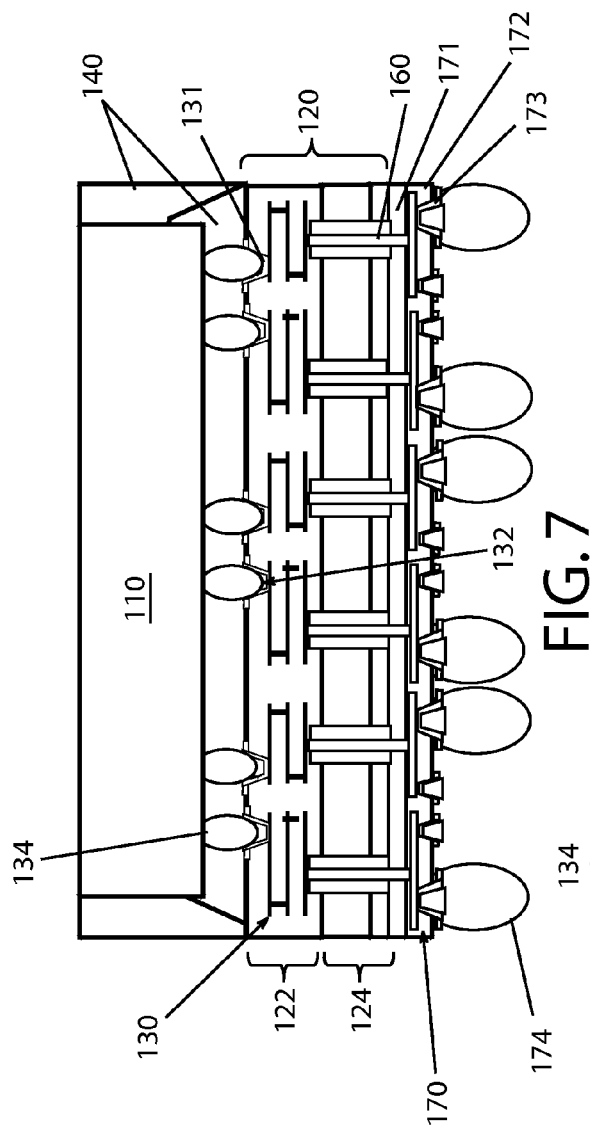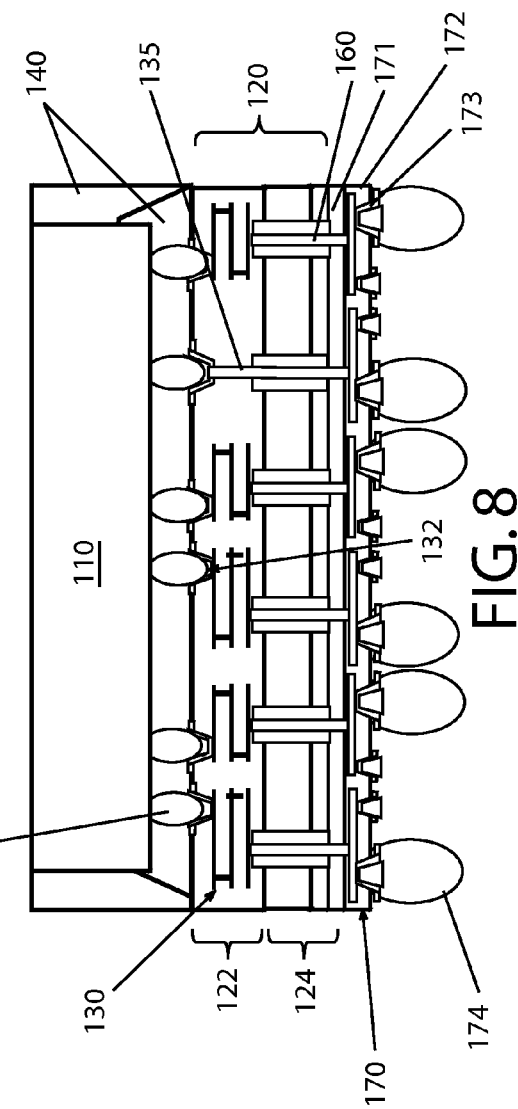

PROCESS FOR FORMING SEMICONDUCTOR STRUCTURE

TECHNICAL FIELD

The present disclosure generally relates to semiconductors, and more particularly to a process for forming a thin TSV semiconductor structure and resulting structure.

BACKGROUND

The present major trend in semiconductor fabrication is moving towards integration of 3D IC chip or die packages having vertically stacked chips and direct electrical inter-chip connections in lieu of other interconnect techniques such as wire bonds and chip edge interconnects. The dies in such 3D IC chip packages may include fine (small) pitch vertical through substrate vias (TSVs) which may be used to form a direct electrical connection to an adjoining stacked die. TSVs offer higher density interconnects and shorter signal paths creating the possibility of forming die packages having smaller form factors and thin die stacks. The TSVs in top dies may be terminated on the back side with very fine pitch microbump arrays for final interconnection to and mounting on a semiconductor substrate.

In 3D IC chip packages, interposers may be used to make electrical connections between adjoining dies or between die packages and another semiconductor substrate which may include various electrically conductive interconnects such as redistribution layer (RDL) structures in some embodiments that may be used to increase or decrease the pitch spacing of the electrical contacts to aid with eventual final mounting of the chip package on another substrate, which may be a package printed circuit board (PCB), packaging substrate, high-density interconnect, or other.

A further current trend is to incorporate TSVs into interposers making them compatible with 3D IC chip package integration. Since the interposers form part of the stacked chip or die package, it is desirable to make the interposers as thin as possible to minimize the height of the chip package.

An improved process for making a thin interposer is desired.

BRIEF DESCRIPTION OF THE DRAWINGS

The features of the embodiments will be described with reference to the following drawings where like elements are labeled similarly, and in which:

FIGS. 1-8 show sequential cross-sectional views through a portion of a semiconductor structure during an exemplary method for fabricating a semiconductor structure according to the present disclosure.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto. The terms "chip" and "die" are used interchangeably herein.

An exemplary method for forming a semiconductor structure 100 according to the present disclosure will now be described. FIGS. 1-8 illustrate cross-sections of a semiconductor structure 100 during sequential fabrication steps. In one embodiment, the semiconductor substrate may be a silicon interposer, which may form part of a 3D IC chip package. In one embodiment, the method steps to be described may be part of a TSV last formation performed after front side RDL metallization and bumping has been completed to electrically interconnect the dies on a wafer.

Referring to FIG. 1, the process for forming semiconductor structure 100 begins by providing a semiconductor substrate 120 having a plurality of chips or dies 110 already mounted previously thereon (also known as a CoW or chip-on-wafer). Accordingly, in some embodiments dies 110 may be top dies. Substrate 120 may be an interposer which may be formed of any suitable material such as without limitation silicon, glass-silicon, or other substrate material used in the semiconductor art. In one embodiment, the substrate 120 is a silicon interposer and the interposer may be a silicon wafer. Substrate 120 has not been thinned at this point in the fabrication process and does not have TSVs formed prior to mounting the dies 110 on the substrate. Substrate 120 may have a total thickness greater than 100 microns before thinning, such as for example in some embodiments without limitation about 25 microns thick.

FIGS. 7 and 8 depict enlarged views of portions of the substrate 120 in FIG. 1, but showing front side metallization including partial through vias and/or redistribution layer (RDL) metallization leads in greater detail which was previously fabricated by any suitable method known in the art and already present in substrate 120 shown in FIG. 1 before the dies 110 were mounted to substrate 120.

Referring to FIGS. 1, 7, and 8, substrate 120 includes an upper portion 122 bounded by a top (front) side or surface 121 facing dies 110 and a lower portion 124 bounded by an opposite bottom (back) side or surface 123. Upper portion 122 is proximate to the dies 110 and lower portion 124 is distal to the dies. Upper portion 122 of substrate 120 may include the front side metallization including a conductive RDL interconnects 130 which are known in the art and may include a combination of variously configured conductive pads, leads, vias, and trenches for forming electrical circuits that conductively connect groups of dies 110 which are shown in FIG. 1 and also form conductive pathways vertically through upper portion 122.

The front side metallization in upper portion 122 of substrate 120 adjacent top surface 121 and dies 110 may include top metal layer bond pads 132 and a plurality of under bump metallization (UBM) pads 131 formed on the pads 132. In some embodiments, the top metal layer bond pads 132 may be made of aluminum. UBM pads 131 may be made of any suitable conductive materials or combinations of materials including without limitation copper in some embodiments. The dies 110 are conductively coupled to the UBM pads 131 and substrate 120 by a plurality of microbumps 134 formed between the dies and substrate as shown. The microbumps 134 may be made of any suitable conductive material, including copper or copper-tin. In one representative embodiment, without limitation, the microbumps 134 may solder bumps having a diameter of about 20 microns with pitch spacing of 50 microns or less consistent with 3D IC chip package construction. The microbumps 134 may be joined to the UBM pads 131 by any suitable process, such as without limitation solder reflow.

In some embodiments, upper portion 122 of substrate 120 may further include integrated passive devices (IPD) in addition to front side RDL interconnect structures. These IPDs may include components such as resistors, capacitors, resonators, filters, or other components commonly found in RF circuitry.

The foregoing RDL interconnect structures in upper portion 122 of substrate 120 and processes used for their fabrication are well known to those skilled in the art. In some embodiments, without limitation, these front side interconnect structures may be formed by back-end-of-line (BEOL) processes commonly used in the art for forming interconnects including damascene and dual damascene processes using a combination of photolithography using patterned photoresist, etching, and conductive material or metal deposition and plating operations. Formation of the front side RDL interconnects in upper portion 122 of substrate 120 precedes mounting the dies 110 on the substrate.

With continuing reference to FIG. 1, the lower portion 124 of substrate 120 at this point in the fabrication process prior to substrate thinning may be a solid monolithic piece of material without any metallization such as internal conductive structures or TSVs yet formed.

In FIG. 2, the semiconductor structure fabrication process continues with an underfill and over-molding process in which a molding compound 140 is dispensed or injected to fill the interstitial spaces (shown in FIG. 1) beneath the dies 110 and between adjacent dies. The molding compound 140 is then cured such as by the application of heat or UV radiation for a period of time to harden the compound. The molding compound 140 may be slightly over-molded to extend above the dies as shown to ensure that the dies are completely encapsulated. The molding compound protects and structurally supports the dies and microbump array. Any suitable kind of commercially-available epoxy or polymer-based molding material or encapsulant used for semiconductor fabrication may be used. In one example, without limitation, the molding compound may be X4832 produced by Sumitomo.

In some embodiments, a two-step molding process may be used wherein a separate underfill material is first injected beneath the dies 110 (i.e. between dies and substrate 120) followed by over-molding with second molding material to encapsulate and fill the spaces between the dies. The underfill material may be any suitable liquid epoxy, deformable gel, silicon rubber, or other material used for underfilling compounds.

In FIG. 3, after the molding compound 140 is cured and hardened, fabrication of the semiconductor structure 100 continues with a planarization process for removing the overburden or excess molding compound 140 to expose the top of dies 110 as shown. Planarizing may be performed by any suitable mechanical and/or chemical-mechanical means used in the art to remove the excess molding compound 140. In some embodiments, the molding compound 140 may be removed by chemical mechanical planing (CMP), grinding with a grit wheel, or other techniques. This planarizing process may also back lap some of the dies 110 since the dies may not all be of uniform thickness or height. The resulting top surface of the dies 110 and molding compound 140 is intended to be relatively planar, as shown in FIG. 3.

Referring now to FIG. 4, a temporary carrier 150 (also referred to as "handle" in the art) is next attached and bonded to the top of dies 110 to facilitate handling the semiconductor structure 100 and supporting the substrate 120 during further fabrication steps. In some embodiments, the carrier 150 may be made of glass, silicon oxide, aluminum oxide, or other suitable materials. In one embodiment, the carrier may be glass. The carrier 150 may be provided with a releasable adhesive 152 such as a UV glue for temporarily bonding the carrier to the semiconductor die structure during processing and then to facilitate easy removal of carrier from the semiconductor structure. Such UV glues loss their adhesive properties when exposed to UV light and serve as a release mechanism. Any suitable type of commercially-available releasable adhesive may be used.

In the next step shown in FIG. 5, a thinning operation is now performed to reduce the thickness of the substrate 120, which in this non-limiting embodiment may be silicon. The semiconductor structure 100 may first be inverted for the silicon thinning step as shown.

With continuing reference to FIG. 5, the silicon thinning operation may be performed by any suitable mechanical or chemical-mechanical process used in the art. In some embodiments, thinning may be performed by grinding using a grinding machine having a scroll plate or wheel with appropriately sized abrasive or grit particles adhered to the wheel. In some embodiments, grit particles may be made of diamond.

In one embodiment, a two-stage grinding process may be used to reduce the thickness of the silicon substrate 120. A first rough grinding step may first be performed on the substrate 120 using large coarse grit material, such as a 40-60 micron size abrasive. A second final grinding step may be subsequently performed on substrate 120 using a fine grit material, such as a 10-30 micron size abrasive material. The second fine grinding step produces a relatively smooth or polished and planar bottom surface 123 (shown inverted in FIG. 5). Alternatively, chemical mechanical planing (CMP) may optionally be used for the second fine grinding step or in addition to the second grinding step thereafter to polish the bottom surface 123 of the substrate 120. The second thickness of the silicon substrate 120 after the thinning operation is completed is less than the first thickness shown in FIG. 1.

In some exemplary embodiments, without limitation, the substrate 120 after thinning and prior to formation of TSVs 160 may have a thickness of less than 100 microns. In some embodiments, the thickness may be about and including 50 microns to about and including 100 microns. In other possible embodiments contemplated, a substrate thickness of less than 50 microns may be achieved. The reduction in substrate thickness advantageously permits a thinner die package to be formed which consumes less vertical height thereby creating a smaller form factor for the die package.

It should be noted that the substrate thinning operation removes silicon material from lower portion 124 of the substrate 120 and does not interfere with or damage the RDL interconnects 130 existing in upper portion 122. In one embodiment, the thinning operation is performed until the conductive front side RDL contact pads, vias, or other conductive structures already formed in upper portion 122 of substrate 120 are revealed or exposed for making subsequent electrical connections to the TSVs to be created in substrate 120 in the next process step.

After the foregoing substrate 120 thinning operation, a plurality of TSVs 160 is next formed in the substrate as shown in FIG. 6. In some embodiments, the lower portion 124 of substrate 120 may contain primarily TSVs. The upper ends of the TSVs 160 may be conductively coupled or connected to any type or combination of conductive contacts in upper portion 122 of the substrate that form part of front side metallization and RDL interconnects 130 including without limitation TSV-to-partial through vias 135 as shown in FIG. 8 and/or TSV-to-conductive pads or horizontal leads as shown in both FIGS. 7 and 8.

The TSVs 160 may be formed by any suitable process used in the art. In one embodiment, without limitation, TSV holes 162 may first be formed by a semiconductor fabrication batch process using photolithography with a patterned photoresist mask, etching, and mask removal as known in the art. In other possible embodiments, laser drilling may be used to form TSV holes 162. The TSV hole formation process selected should offer an appropriate degree of control with respect to accurately controlling and limiting the depth of the holes 162 created in substrate 120 so that the etching or drilling process is stopped when the holes are just deep enough to expose the existing via 135 or other conductive interconnects 130 contacts in the RDL (in upper portion 122) to be joined to the TSVs 160, without being too deep which may damage the interconnects or vias.

After the TSV holes 162 are formed in substrate 120, the holes are next filled with an appropriate conductive material by any suitable method used in the art to complete formation of TSVs 160. TSVs 160 may be made of any suitable conductive material used in the art for such interconnects, including without limitation copper, tungsten, nickel, titanium, polysilicon, and others. In one embodiment, the TSVs 160 are copper. In some embodiments, an adhesion or barrier layer such as titanium may first be deposited in TSV holes 162 followed by deposition of a seed layer of copper by PVD (physical vapor deposition), CVD (chemical vapor deposition), or other film formation processes. The TSV holes 162 may then be completely filled by copper electroplating to complete the TSVs 160. The resultant semiconductor structure 100 is shown in FIG. 6.

TSVs 160 may have any suitable diameter depending on the die package design requirements and process used to form the TSVs.

It will be appreciated that the TSVs 160 are formed for the full depth of lower portion 124 in semiconductor substrate 120 and the back side ends of the TSVs are exposed and essentially ready for formation of the back side RDL. Accordingly, no further thinning of the substrate 120 is needed to expose the TSVs after their formation unlike some traditional assembly processes where TSVs are formed first prior to silicon thinning. The substrate 120, as disclosed herein, was previously thinned to the desired thickness as shown in FIG. 5.

Advantageously, embodiments of the present semiconductor structure formation process disclosed herein reduces TSV protrude costs compared to those foregoing traditional process since the TSV last formation is more easily accomplished and reliable. In addition, an added benefit of the present process is that the substrate 120 thickness can be reduced to be much thinner than the traditional assembly process due to the ultra-thin substrate which has been fully protected by the top die and molding. In some embodiments, top die thickness could be made thicker being enough to support and provide the wafer strength. Moreover, ultra-thin substrate could make it easier to produce TSVs. It will further be appreciated by those in the art the TSV last formation process described herein may readily be adapted to TSV middle and TSV first portions of the semiconductor structure formation processes.

Returning now to further description of the semiconductor structure fabrication process, following formation of the TSVs 160 as described above, the bottom surface 123 of substrate 120 may optionally be planed before further processing to remove any overburden of copper or other conductive material used for TSVs 160 that protrude beyond the bottom surface 123 of substrate 120. This step prepares the bottom surface 123 for the formation of further RDL interconnects, as described herein, to complete formation of the die or chip package. In one embodiment, the planing operation may be CMP (chemical mechanical planing); however, other suitable planing processes may be used.

Referring to FIGS. 7 and 8, back side metallization may next be performed to build RDL interconnects 170 for completing the C4 (i.e. controlled collapse chip connections) or "flip chip" die package which may ultimately be mounted on a system board such as a PCB (printed circuit board). The back side metallization includes formation of conductive redistribution layer (RDL) interconnects 170 as commonly known to those in the art that may include a combination of conductive pads, leads, vias, trenches, and bumps. This final metallization stage may include first depositing a first dielectric passivation layer 171 on bottom surface 123 of semiconductor substrate 120. Passivation layer 171 is next patterned using photolithography, and then subsequently etched to create openings that expose the ends of TSVs 160 to permit the back side RDL metallization to make electrical connections to the TSVs. A second dielectric layer 172 may be deposited on passivation layer 171. The back side RDL interconnects 170 are next formed in dielectric layer 172 including an array of C4 bumps 174 on UBM pads 173. Bumps 174 may be made of any suitable material commonly used for C4 bumps and may be formed by any suitable process known in the art for in fabricating flip chip connections. In some embodiments, bumps 174 may be made of Cu. The bumps 174 may have wider pitch spacing than microbumps 134 and on the order of about 150-200 microns in some embodiments.

After formation of the back side RDL interconnects and C4 bump array as shown in FIGS. 7 and 8, the temporary carrier 150 is released and removed from the semiconductor structure 100 and dies 110 by any suitable manner. A suitable cleaning process may be used to remove any residual adhesive from the top surfaces of the dies 110 and molding compound 140 filling the interstitial spaces between the dies. The completed semiconductor structure 100 may next be further processed as desired, and is ready for mounting on a package PCB (not shown) using any suitable flip chip mounting technique used in the art. The PCB may include a wide spaced BGA (ball grid array) on the back side for mounting on a system board as will be well known in the art.

FIG. 7 shows semiconductor structure 100 having a thinned substrate 120 in which TSVs 160 interconnect the front side RDL 130 to the back side RDL 170. FIG. 8 shows a semiconductor structure 100 that is essentially identical to that of FIG. 7, but with the upper portion 122 of substrate 120 including at least one partial via 135 connected to one of the TSVs 160. Accordingly, the semiconductor structure may include any combination of various types of conductive interconnects that are conductively connected to the TSVs 160.

In one embodiment according to the present disclosure, a method for fabricating a semiconductor structure includes:

providing a semiconductor substrate including a plurality of dies mounted thereon, the substrate including a first portion proximate to the dies and a second portion distal to the dies; thinning the second portion of the substrate; and forming a plurality of conductive through substrate vias (TSVs) in the second portion of the substrate after thinning.

In another embodiment, a method for fabricating a semiconductor structure includes: providing a semiconductor substrate including a plurality of dies mounted thereon, the substrate including a first portion proximate to the dies having front side metallization and a second portion distal to the dies; attaching a temporary carrier to the dies for handling the semiconductor structure; thinning the second portion of the substrate; forming a plurality of conductive through substrate vias in the second portion after thinning, wherein the front side metallization is electrically connected to the through substrate vias; and forming back side redistribution layer metallization on the substrate, wherein the back side redistribution layer metallization is electrically connected to the through substrate vias.

In yet another embodiment, a method for fabricating a semiconductor structure includes: providing a silicon substrate including a plurality of dies mounted thereon, the substrate including a first portion proximate to the dies having conductive front side interconnects disposed therein and a second portion distal to the dies, wherein the second portion does not contain metallization; attaching a temporary carrier to dies for handling the semiconductor structure; thinning the second portion of the substrate; forming a plurality of conductive through silicon vias in the second portion of the substrate after thinning; electrically connecting the through silicon vias to the front side interconnects; forming back side redistribution layer interconnects on the substrate; and electrically connecting the back side interconnects to the through silicon vias.

While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that the present disclosure may be embodied in other forms, structures, arrangements, proportions, sizes, and with other elements, materials, and components, without departing from the spirit or essential characteristics thereof. In addition, numerous variations in the methods/processes and/or control logic as applicable described herein may be made without departing from the spirit of the disclosure. One skilled in the art will further appreciate that the disclosure may be used with many modifications of structure, arrangement, proportions, sizes, materials, and components and otherwise, used in the practice of the disclosure, which are particularly adapted to specific environments and operative requirements without departing from the principles of the present disclosure. The presently disclosed embodiments are therefore to be considered in all respects as illustrative and not restrictive, the scope of the disclosure being defined by the appended claims and equivalents thereof, and not limited to the foregoing description or embodiments. Rather, the appended claims should be construed broadly, to include other variants and embodiments of the disclosure, which may be made by those skilled in the art without departing from the scope and range of equivalents of the disclosure.

What is claimed is:

1. A method for fabricating a semiconductor structure comprising:

providing a substrate including a plurality of dies mounted thereon, the substrate including a first portion proximate to the dies and a second portion distal to the dies, the first portion of the substrate including front side metallization electrically connected to the dies, the front side metallization comprising conductive pads and a redistribution layer interconnect;

thinning the second portion of the substrate; and forming a plurality of conductive through substrate vias (TSVs) in the second portion of the substrate after thinning.

2. The method of claim 1, wherein prior to the thinning step, the second portion does not contain metallization.

3. The method of claim 1, further comprising filling interstitial spaces between the dies with a molding compound before the thinning step.

4. The method of claim 1, further comprising attaching a temporary carrier to the dies before the thinning step.

5. The method of claim 1, wherein the substrate has a total thickness of less than 100 microns after the thinning step.

6. The method of claim 1, further comprising forming back side redistribution layer metallization after forming the through substrate vias, the back side redistribution layer metallization being electrically connected to the conductive through substrate vias.

7. The method of claim 6, further comprising forming a passivation layer between the back side redistribution layer metallization and the second portion of the substrate prior to the step of forming the back side redistribution layer metallization.

8. The method of claim 6, wherein the back side redistribution layer metallization forming step includes forming a ball grid array for mounting the semiconductor structure to a printed circuit board.

9. The method of claim 1, wherein the thinning step involves mechanically grinding the second portion of the substrate.

10. A method for fabricating a semiconductor structure comprising:

providing a substrate including a plurality of dies mounted thereon, the substrate including a first portion proximate to the dies having front side metallization and a second portion distal to the dies, the first portion of the substrate including front side metallization electrically connected to the dies, the front side metallization comprising conductive pads and a redistribution layer interconnect;

attaching a temporary carrier to the dies;

thinning the second portion of the substrate while the temporary carrier is attached to the dies;

forming a plurality of conductive through substrate vias in the second portion after thinning, wherein the front side metallization is electrically connected to the conductive through substrate vias; and forming back side redistribution layer metallization on the substrate, wherein the back side redistribution layer metallization is electrically connected to the conductive through substrate vias.

11. The method of claim 10, wherein prior to the thinning step, the second portion does not contain metallization.

12. The method of claim 10, further comprising filling interstitial spaces between the dies with a molding compound before attaching the carrier.

13. The method of claim 12, further comprising planarizing the semiconductor structure after the filling step to remove any excess molding compound on top of the dies before attaching the carrier to the dies.

14. The method of claim 10, wherein the back side redistribution layer metallization forming step includes forming a ball grid array for mounting the semiconductor structure to a printed circuit board.

15. A method for fabricating a semiconductor structure comprising:
    providing a substrate comprising silicon and including a plurality of dies mounted thereon, the substrate including a first portion proximate to the dies having conductive pads and conductive front side interconnects disposed therein and a second portion distal to the dies, the conductive front side interconnects comprising a redistribution layer interconnect, wherein the second portion does not contain metallization;
    attaching a temporary carrier to the dies;
    thinning the second portion of the substrate;
    forming a plurality of conductive through silicon vias in the second portion of the substrate after thinning;
    electrically connecting the conductive through silicon vias to the conductive front side interconnects;
    forming back side redistribution layer interconnects on the substrate; and
    electrically connecting the back side redistribution layer interconnects to the conductive through silicon vias.

16. The method of claim 15, further comprising filling interstitial spaces between the dies with a molding compound before attaching the temporary carrier to the dies.

17. The method of claim 15, wherein the step of forming the back side redistribution layer interconnects includes forming a ball grid array for mounting the semiconductor structure to a printed circuit board.

18. The method of claim 15, wherein the thinning step involves mechanically grinding the second portion of the substrate.

* * * * *